United States Patent
Kang

(10) Patent No.: US 10,505,526 B2
(45) Date of Patent: Dec. 10, 2019

(54) HIGH FREQUENCY MULTICHANNEL PWM CONTROL APPARATUS HAVING LOW POWER FUNCTION

(71) Applicant: SAMSUNG ELECTRO-MECHANICS CO., LTD., Suwon-si (KR)

(72) Inventor: Jin Yong Kang, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/797,897

(22) Filed: Oct. 30, 2017

(65) Prior Publication Data

US 2018/0302078 A1    Oct. 18, 2018

(30) Foreign Application Priority Data

Apr. 13, 2017    (KR) .................. 10-2017-0048048

(51) Int. Cl.
*H03K 7/08* (2006.01)

(52) U.S. Cl.
CPC ...................... *H03K 7/08* (2013.01)

(58) Field of Classification Search
CPC .................. H03K 7/08; H03K 3/017
See application file for complete search history.

(56) References Cited

U.S. PATENT DOCUMENTS

| | | | | |
|---|---|---|---|---|
| 7,017,069 B2* | 3/2006 | Kudo | .................. | H03K 7/08 713/500 |
| 7,239,116 B2* | 7/2007 | Tang | .................. | H02M 3/157 323/266 |
| 7,376,182 B2* | 5/2008 | Kris | .................. | H03K 7/08 341/53 |
| 7,627,032 B2* | 12/2009 | O'Malley | .................. | H02M 3/33515 375/238 |
| 8,351,480 B2* | 1/2013 | Allie | .................. | H03K 7/08 372/55 |
| 9,184,738 B2* | 11/2015 | Matoba | .................. | H03K 7/08 |
| 9,628,000 B2* | 4/2017 | Schwantner | .................. | H04B 15/025 |
| 2015/0002201 A1* | 1/2015 | Kitagawa | .................. | H03K 5/1565 327/175 |

FOREIGN PATENT DOCUMENTS

JP    11-109919 A    4/1999

* cited by examiner

*Primary Examiner* — Lincoln D Donovan
*Assistant Examiner* — Colleen J O Toole
(74) *Attorney, Agent, or Firm* — NSIP Law

(57) ABSTRACT

A high frequency multichannel pulse width modulation (PWM) control apparatus includes a pre-scaler configured to divide a frequency of a main clock signal to generate a first clock signal, and a multichannel PWM generator including first to n-th PWM generators, the PWM generators comprising corresponding periods and duties, configured to generate, respectively, first to n-th PWM signals, through first and second N/2-bit counting for the main clock signal, using the first clock signal, wherein each of the first to n-th PWM generators performs the first N/2-bit counting on the main clock signal based on the first clock signal, a corresponding coarse duty value, and a corresponding coarse period value to generate a fine clock signal, and performs the second N/2-bit counting on the fine clock signal based on a corresponding fine duty value and a corresponding fine period value to generate a corresponding PWM signal.

19 Claims, 6 Drawing Sheets

HIGH FREQUENCY MULTICHANNEL PWM CONTROL APPARATUS HAVING LOW POWER FUNCTION

CROSS-REFERENCE TO RELATED APPLICATIONS

This application claims the benefit under 35 USC 119(a) of Korean Patent Application No. 10-2017-0048048 filed on Apr. 13, 2017 in the Korean Intellectual Property Office, the entire disclosure of which is incorporated herein by reference for all purposes.

BACKGROUND

1. Field

The following description relates to a high frequency (HF) multichannel pulse width modulation (PWM) control apparatus having a low power function.

2. Description of Related Art

In general, a pulse width modulation (PWM) approach has been used in order to control an actuator such as a voice coil motor.

Recently, a PWM manner in which a PWM period is 1 MHz or more and a resolution is eight bits or more has been used. For example, when the PWM period is 1 MHz and the resolution is ten bits, a PWM pulse may use 1 GHz clocks.

When an existing PWM control apparatus has a high frequency multichannel structure, the existing PWM control apparatus may include high frequency counters provided for each channel in order to count high frequency clocks.

As an example, a PWM manner of using the 1 GHz clocks may be applied to a next generation optical image stabilizer (OIS) driver integrated circuit (IC), and the 1 GHz clocks may be used in this example.

In this example, the high frequency counters consume current depending on shifts of high frequency clocks, for example, the 1 GHz clocks. Therefore, as the number of channels is increased and a resolution becomes higher, the amount of consumed current increases.

As an example, when an ultrafine process is used, a high-speed counter may be easily implemented, but when a 0.18 μm or 0.13 μm process is used, a delay time of an element may be relatively long. Thus, it may not be easy to implement a counter having a high resolution, for example, ten bits, using the 1 GHz clocks. Furthermore, as the resolution is increased, the consumed current also increases.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a high frequency multichannel pulse width modulation (PWM) control apparatus includes a pre-scaler configured to divide a frequency of a main clock signal to generate a first clock signal, and a multichannel PWM generator including first to n-th PWM generators, where n is a natural number that is 2 or more, the PWM generators having corresponding periods and duties and configured to generate, respectively, first to n-th PWM signals, through first and second N/2-bit counting for the main clock signal, where N is a number of bits of a resolution of the high frequency multichannel PWM control apparatus, using the first clock signal, wherein each of the first to n-th PWM generators performs the first N/2-bit counting on the main clock signal based on the first clock signal, a corresponding coarse duty value, and a corresponding coarse period value to generate a fine clock signal, and performs the second N/2-bit counting on the fine clock signal based on a corresponding fine duty value and a corresponding fine period value to generate a corresponding PWM signal.

Each of the first to n-th PWM generators may include a k-th coarse controller configured to generate the fine clock signal based on the main clock signal, the first clock signal, the corresponding coarse duty value, and the corresponding coarse period value, and a k-th fine controller configured to generate the corresponding PWM signal based on the fine clock signal, the corresponding fine duty value, and the corresponding fine period value.

The k-th coarse controller may include a first N/2-bit counter configured to provide a first count value based on counting the first clock signal, a first comparator configured to provide a first comparison signal based on comparing the first count value and a k-th coarse duty value, a second comparator configured to provide a second comparison signal based on comparing the first count value and a k-th coarse period value, a first OR circuit configured to provide a clock enable signal based on performing an OR operation on the first comparison signal and the second comparison signal, and a first AND circuit configured to provide a k-th fine clock signal based on the clock enable signal and the main clock signal.

The k-th fine controller may include a second N/2-bit counter configured to provide a second count value based on counting the k-th fine clock signal, a third comparator configured to provide a clear signal based on comparing the second count value and a k-th fine duty value, a fourth comparator configured to provide a set signal based on comparing the second count value and a k-th fine period value, a second OR circuit configured to perform an OR operation on the set signal and a begin signal, and a holding circuit configured to set an output terminal based on an output signal from the second OR circuit, reset the output terminal based on the clear signal, and provide a k-th PWM signal.

The third comparator may provide the clear signal having an active level in response to the second count value and the k-th fine duty value being the same, and the fourth comparator may provide the set signal having an active level in response to the second count value and the k-th fine period value being the same.

The holding circuit may set the output terminal in response to a level of the output signal from the second OR circuit being an active level, reset the output terminal in response to a level of the clear signal being an active level, and provide the k-th PWM signal.

The holding circuit may be an SR flip-flop or an SR latch.

The first N/2 bit counter may be initialized in response to either one or both of a begin or a set signal having an active level and the second N/2 bit counter may be initialized in response to the begin signal having an active level.

The first comparator may provide the first comparison signal having an active level in response to the first count value and the k-th coarse duty value being the same, and the second comparator may provide the second comparison signal having an active level in response to the first count value and the k-th coarse period value being the same.

The first AND circuit may include an AND gate configured to perform an AND operation on the clock enable signal and the main clock signal and to provide the k-th fine clock signal based on a result of the AND operation.

In another general aspect, a high frequency multichannel pulse width modulation (PWM) control apparatus includes a pre-scaler configured to divide a frequency of a main clock signal to generate a first clock signal, and a multichannel PWM generator including first to n-th PWM generators, where n is a natural number that is 2 or more, the PWM generators comprising corresponding periods and duties and configured to generate, respectively, first to n-th PWM signals through first and second N/2-bit counting for the main clock signal, where N is a number of bits of a resolution of the high frequency multichannel PWM control apparatus, using the first clock signal, wherein the first PWM generator includes a first coarse controller configured to perform the first N/2-bit counting on the main clock signal based on the first clock signal, a first coarse duty value, and a first coarse period value to generate a first fine clock signal, and a first fine controller configured to perform the second N/2-bit counting on the first fine clock signal based on a first fine duty value and a first fine period value to generate a first PWM signal, and the n-th PWM generator includes an n-th coarse controller configured to perform the first N/2-bit counting on the main clock signal based on the first clock signal, an n-th coarse duty value, and an n-th coarse period value to generate an n-th fine clock signal, and an n-th fine controller configured to perform the second N/2-bit counting on the n-th fine clock signal based on an n-th fine duty value and an n-th fine period value to generate an n-th PWM signal.

A k-th coarse controller includes a first N/2-bit counter configured to provide a first count value by counting the first clock signal, a first comparator configured to provide a first comparison signal by comparing the first count value and a k-th coarse duty value, a second comparator configured to provide a second comparison signal by comparing the first count value and a k-th coarse period value, a first OR circuit configured to provide a clock enable signal by performing an OR operation on the first comparison signal and the second comparison signal, and a first AND circuit configured to provide a k-th fine clock signal based on the clock enable signal and the main clock signal.

A k-th fine controller may include a second N/2-bit counter configured to provide a second count value by counting the k-th fine clock signal, a third comparator configured to provide a clear signal by comparing the second count value and a k-th fine duty value, a fourth comparator configured to provide a set signal by comparing the second count value and a k-th fine period value, a second OR circuit configured to perform an OR operation on the set signal and a begin signal, and a holding circuit configured to set an output terminal based on an output signal from the second OR circuit, to reset the output terminal based on the clear signal, and to provide a k-th PWM signal.

The third comparator may provide the clear signal having an active level in response to the second count value and the k-th fine duty value being the same, and the fourth comparator may provide the set signal having an active level in response to the second count value and the k-th fine period value being the same.

The holding circuit may set the output terminal in response to a level of the output signal from the second OR circuit being an active level, reset the output terminal in response to a level of the clear signal being an active level, and provide the k-th PWM signal.

The holding circuit may be an SR flip-flop or an SR latch.

The first N/2 bit counter may be initialized in response to either one or both of a begin or a set signal having an active level and the second N/2 bit counter may be initialized in response to the begin signal having an active level.

The first comparator may provide the first comparison signal having an active level in response to the first count value and the k-th coarse duty value being the same, and the second comparator may provide the second comparison signal having an active level in response to the first count value and the k-th coarse period value being the same.

The first AND circuit may include an AND gate configured to perform an AND operation on the clock enable signal and the main clock signal and to provide the k-th fine clock signal based on a result of the AND operation.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
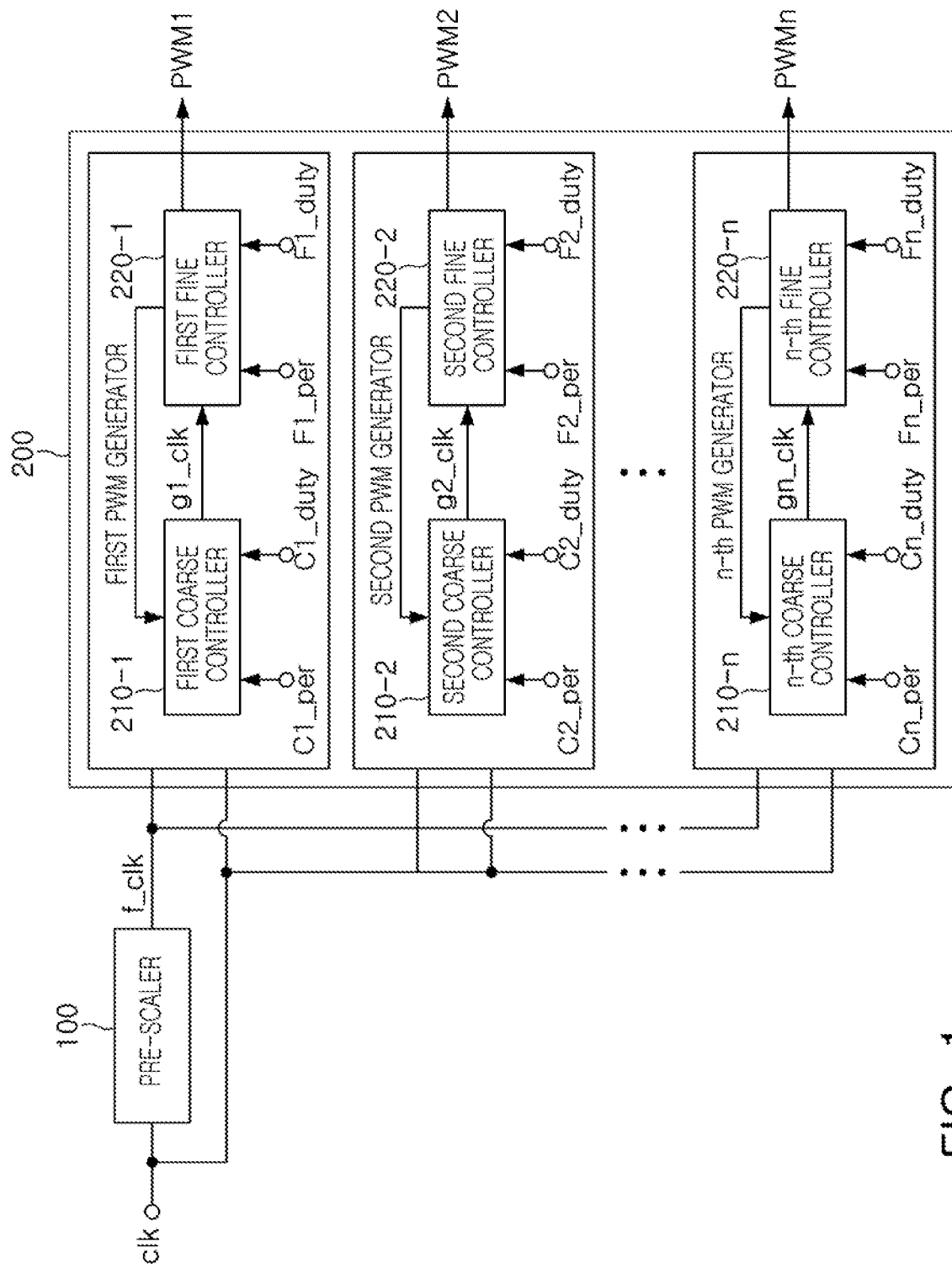
FIG. 1 is a block diagram illustrating a high frequency multichannel pulse width modulation (PWM) control apparatus according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a block diagram illustrating a high frequency multichannel pulse width modulation (PWM) control apparatus according to an example.

Referring to the example of FIG. 1, the high frequency multichannel PWM control apparatus according to the example includes a pre-scaler 100 and a multichannel PWM generator 200.

The pre-scaler 100, which is a frequency divider that divides a frequency of a main clock signal clk, divides the frequency of the main clock signal clk to generate a first clock signal f_clk that has a frequency lower than that of the main clock signal clk.

As an example, when the frequency of the main clock signal clk is 1 GHz and a frequency dividing ratio of the pre-scaler 100 is 4, the frequency of the first clock signal f_clk is 250 MHz.

For example, the multichannel PWM generator 200 includes first to n-th PWM generators 200-1 to 200-n. The first to n-th PWM generators 200-1 to 200-n generate, respectively, first to n-th PWM signals PWM1 to PWMn, where n is a natural number that is 2 or greater. The first to n-th PWM signals PWM1 to PWMn have corresponding periods and duties through first and second N/2-bit counting for the main clock signal, using the first clock signal f_clk.

As an example, each of the first to n-th PWM generators 200-1 to 200-n performs the first N/2-bit counting on the main clock signal clk based on the first clock signal f_clk, a k-th coarse duty value Ck_duty, and a k-th coarse period value Ck_per in order to generate a k-th fine clock signal gk_clk. Also, in such an example, each of the first to n-th PWM generators 200-1 to 200-n performs the second N/2-bit counting on the k-th fine clock signal gk_clk on the basis of a k-th fine duty value Fk_duty and a k-th fine period value Fk_per to generate a k-th PWM signal PWMk.

For example, the first PWM generator 200-1 includes a first coarse controller 210-1 and a first fine controller 220-1.

The first coarse controller 210-1 performs the first N/2-bit counting on the main clock signal clk on the basis of the first clock signal f_clk, a first coarse duty value C1_duty, and a first coarse period value C1_per. As a result, the first coarse controller 210-1 generates a first fine clock signal gk_clk.

Accordingly, the first fine controller 220-1 performs the second N/2-bit counting on the first fine clock signal gk_clk on the basis of a first fine duty value F1_duty and a first fine period value F1_per. As a result, the first fine controller 220-1 generates the first PWM signal PWM1.

Likewise, in such an example, the second PWM generator 200-2 includes a second coarse controller 210-2 and a second fine controller 220-2.

Similarly, the second coarse controller 210-2 performs the first N/2-bit counting on the main clock signal clk on the basis of the first clock signal f_clk, a second coarse duty value C2_duty, and a second coarse period value C2_per to generate a second fine clock signal g2_clk.

Also, similarly, the second fine controller 220-2 performs the second N/2-bit counting on the second fine clock signal g2_clk on the basis of a second fine duty value F2_duty and a second fine period value F2_per to generate the second PWM signal PWM2.

Accordingly, the n-th PWM generator 200-n includes an n-th coarse controller 210-n and an n-th fine controller 220-n.

In an analogous manner, the n-th coarse controller 210-n performs the first N/2-bit counting on the main clock signal clk on the basis of the first clock signal f_clk, an n-th coarse duty value Cn_duty, and an n-th coarse period value Cn_per to generate an n-th fine clock signal gn_clk.

Continuing with a pattern of analogous operation, the n-th fine controller 220-n performs the second N/2-bit counting on the n-th fine clock signal gn_clk on the basis of an n-th fine duty value Fn_duty and an n-th fine period value Fn_per to generate the n-th PWM signal PWMn. Thus, each of the PWM generators operates in a generally similar manner, with similar patterns of operation.

In addition, in an example, when each of the first to n-th PWM generators 200-1 to 200-n corresponds to a k-th PWM generator 200-k, where k is a natural number that is at least 1 and at most n, the k-th PWM generator 200-k includes a k-th coarse controller 210-k and a k-th fine controller 220-k.

Thus, the k-th coarse controller 210-k performs the first N/2-bit counting on the main clock signal clk on the basis of the first clock signal f_clk, a k-th coarse duty value Ck_duty, and a k-th coarse period value Ck_per to generate a k-th fine clock signal gk_clk.

Also, in such an example, the k-th fine controller 220-k performs the second N/2-bit counting on the k-th fine clock signal gk_clk on the basis of a k-th fine duty value Fk_duty and a k-th fine period value Fk_per to generate the k-th PWM signal PWMk.

In the respective drawings in the present disclosure, unnecessary redundant descriptions for components denoted by the same reference numerals and having the same functions are omitted for brevity. However, contents differing from each other are described with respect to the respective drawings.

Figure 2:
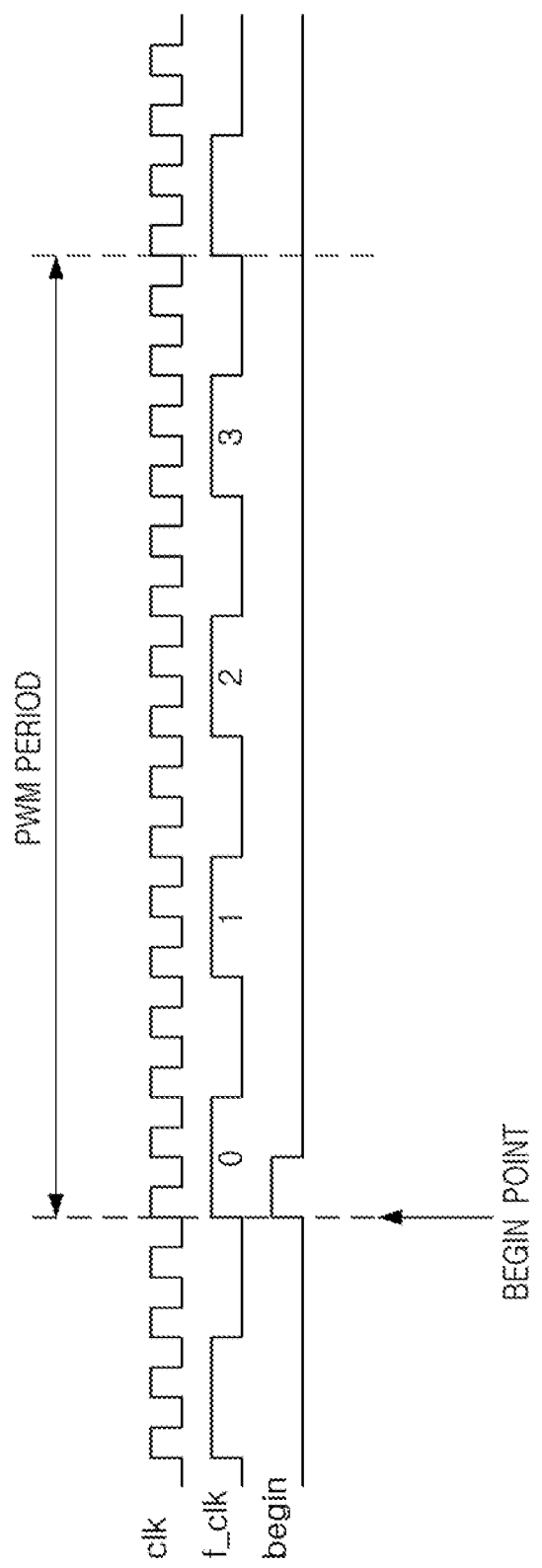
FIG. 2 includes timing charts illustrating a main clock signal, a first clock signal, and a begin signal according to an example.

FIG. 2 includes timing charts illustrating a main clock signal, a first clock signal, and a begin signal according to an example.

Referring to the examples of FIGS. 1 and 2, when a resolution of the high frequency multichannel PWM control apparatus is four bits, the frequency dividing ratio of the pre-scaler 100 is 4. In this example, the pre-scaler 100 divides the frequency of the main clock signal clk, which is 1 GHz, by 4 to generate the first clock signal f_clk, which has a frequency of 250 MHz.

It is to be noted that FIG. 2 illustrates examples of the main clock signal clk and the first clock signal f_clk. However, the main clock signal clk and the first clock signal f_clk are not limited to the examples presented in FIG. 2, and other examples of the main clock signal clk and the first clock signal f_clk fall within the scope of possible examples.

Figure 3:
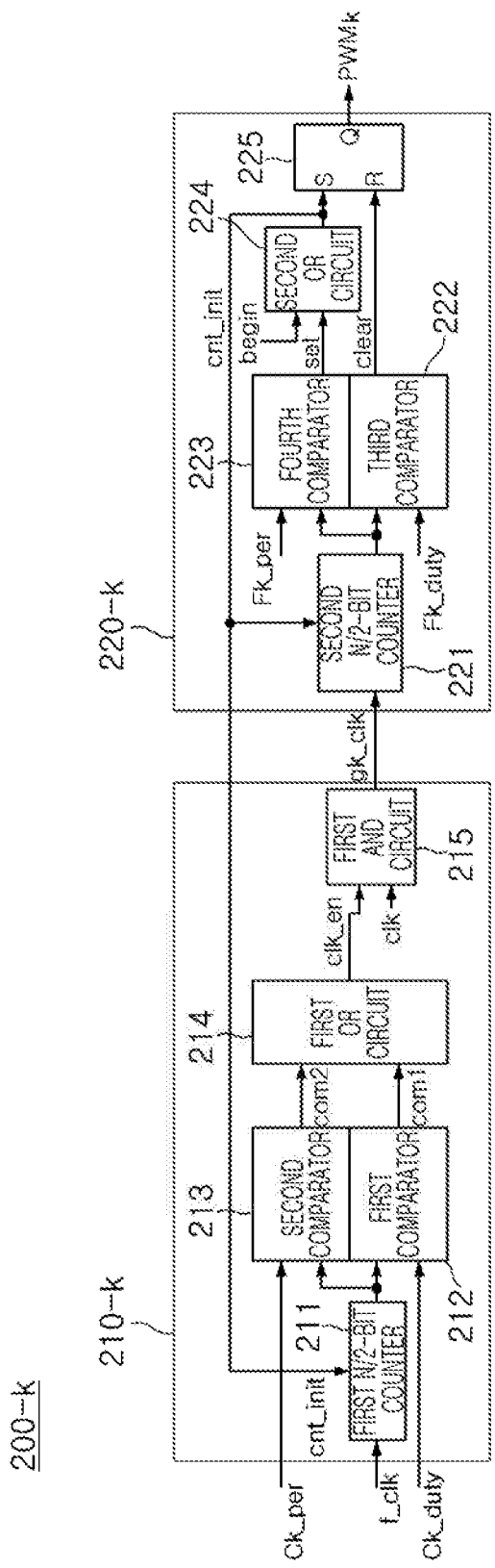
FIG. 3 is a block diagram illustrating an example of a k-th PWM generator according to an example.

FIG. 3 is a block diagram illustrating an example of a k-th PWM generator according to an example.

Referring to the example of FIG. 3, the k-th coarse controller 210-k includes a first N/2-bit counter 211, where N is the number of bits of a resolution, a first comparator 212, a second comparator 213, a first OR circuit 214, and a first AND circuit 215.

In the example of FIG. 3, the first N/2-bit counter 211 counts the first clock signal f_clk and provides a first count value.

As an example, when the resolution of the high frequency multichannel PWM control apparatus is eight bits, the first N/2-bit counter 211 is a four-bit counter.

For example, the first comparator 212 compares the first count value and the k-th coarse duty value Ck_duty with each other and provides a first comparison signal com1. Furthermore, the second comparator 213 compares the first count value and the k-th coarse period value Ck_per with each other and provides a second comparison signal com2.

As an example, the first comparator 212 provides the first comparison signal com1 having an active level, for example, 1 or a high level, in response to the first count value and the k-th coarse duty value Ck_duty being the same as each other. Also, the second comparator 213 provides the second comparison signal com2 having an active level, for example, 1, in response to the first count value and the k-th coarse period value Ck_per being the same as each other.

As an example, when the resolution of the high frequency multichannel PWM control apparatus is ten bits, the k-th coarse duty value Ck_duty is 499, the k-th coarse period value Ck_per is 999, and the first count value is any one value of 0 to 999.

As another example, when the resolution of the high frequency multichannel PWM control apparatus is two bits, the k-th coarse duty value Ck_duty is 2, the k-th coarse period value Ck_per is 3, and the first count value is any one of 0 to 3.

The first OR circuit 214 performs an OR operation on the first comparison signal com1 and the second comparison signal com2 and provides a clock enable signal clk_en.

As an example, the first OR circuit 214 includes an OR gate that performs the OR operation on the first comparison signal com1 and the second comparison signal com2.

The first AND circuit 215 provides the k-th fine clock signal gk_clk on the basis of the clock enable signal clk_en and the main clock signal clk.

As an example, the first AND circuit 215 includes an AND gate that performs an AND operation on the clock enable signal clk_en and the main clock signal clk and provides the k-th fine clock signal gk_clk.

In addition, referring to the example of FIG. 3, the k-th fine controller 220-k includes a second N/2-bit counter 221, a third comparator 222, a fourth comparator 223, a second OR circuit 224, and a holding circuit 225.

In such an example, the second N/2-bit counter 221 counts the k-th fine clock signal gk_clk and provides a second count value.

As an example, when the resolution of the high frequency multichannel PWM control apparatus is eight bits, the second N/2-bit counter 221 is a four-bit counter.

In such an example, the first N/2-bit counter 211 performs the first N/2-bit counting, and the second N/2-bit counter 221 performs the second N/2-bit counting.

In the example of FIG. 3, the third comparator 222 compares the second count value and the k-th fine duty value Fk_duty with each other. Based on the comparison, the third comparator 222 provides a clear signal clear. The fourth comparator 223 compares the second count value and the k-th fine period value Fk_per with each other and provides a set signal set.

As an example, the third comparator 222 provides the clear signal clear as having an active level, for example, 1, in response to the second count value and the k-th fine duty value Fk_duty being the same as each other. The fourth comparator 223 provides the set signal set as having an active level, for example, 1, in response to the second count value and the k-th fine period value Fk_per being the same as each other.

The second OR circuit 224 performs an OR operation on the set signal set and a begin signal begin and provides an output signal to a set terminal of the holding circuit 225.

As an example, the OR circuit 224 includes an OR gate that performs the OR operation on the set signal set and the begin signal begin.

Accordingly, the holding circuit 225 sets an output terminal on the basis of the output signal from the second OR circuit 224, resets the output terminal on the basis of the clear signal, and provides the k-th PWM signal PWMk.

As an example, the holding circuit 225 is an RS latch or RS flip-flop that sets the output terminal on the basis of the output signal from the second OR circuit 224 and resets the output terminal on the basis of the clear signal.

For example, the holding circuit 225 sets the output terminal in response to a level of the output signal from the second OR circuit 224 being an active level, for example, 1, resets the output terminal in response to a level of the clear signal clear being an active level, for example, 1, and provides the k-th PWM signal PWMk.

As described above, according to the example, the k-th coarse controller 210-k includes the first N/2-bit counter 211, where N is the number of bits of a resolution, which is one N/2-bit counter. The k-th fine controller 220-k includes the second N/2-bit counter 221, which is another N/2-bit counter. That is, according to the example, two N/2-bit counters are operated separately instead of the existing one N-bit counter. As a result, the number of high frequency counters having a high resolution is reduced as compared to the number of channels. As a result, a switching current and an entire consumed current are reduced.

Figure 4:
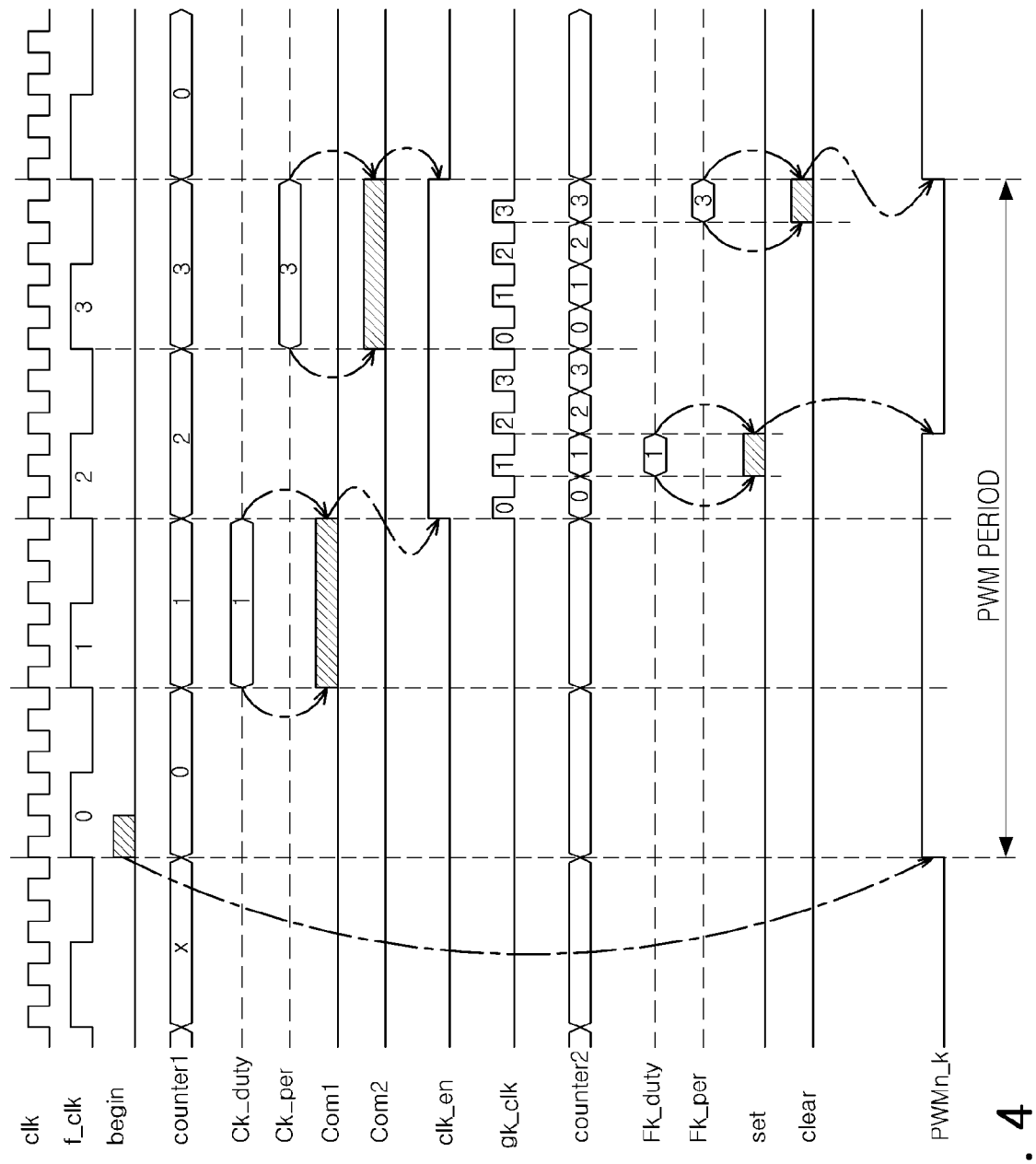
FIG. 4 includes operation timing charts of the high frequency multichannel PWM control apparatus according to an example.

FIG. 4 includes operation timing charts of the high frequency multichannel PWM control apparatus according to an example.

In the example of FIG. 4, operation timing examples of the high frequency multichannel PWM control apparatus, as illustrated in FIGS. 1 through 3, in a case in which the k-th coarse duty value Ck_duty is 2, the k-th coarse period value Ck-per is 3, the k-th fine duty value Fk_duty is 1, and the k-th fine period value Fk_per is 3, when a resolution of the high frequency multichannel PWM control apparatus is four bits (N=4) are illustrated.

Referring to the examples of FIGS. 1 through 4, when the high frequency multichannel PWM control apparatus according to the example has the resolution of four bits, the first N/2-bit counter 211 is operated as a two-bit counter, and the second N/2-bit counter 221 is operated as a two-bit counter.

In the examples of FIGS. 1 through 4, each of the first N/2-bit counter 211 and the second N/2-bit counter 221 counts $2^2$ or 4 clocks.

First, when a begin signal begin is input, the first N/2-bit counter 211 and the second N/2-bit counter 221 are initialized to 0 and commence count operations.

For example, the pre-scaler 100 divides the frequency of the main clock signal clk to generate the first clock signal f_clk. The pre-scaler 100 also supplies the first clock signal f_clk and the main clock signal clk to the k-th coarse controller 210-k of the multichannel PWM generator 200.

As an example, when the frequency dividing ratio of the pre-scaler 100 is 4, the pre-scaler 100 generates the first clock signal f_clk that has the frequency corresponding to ¼ of the frequency of the main clock signal, and provides the first clock signal f_clk to the first N/2-bit counter 211 of the k-th coarse controller 210-k.

The first N/2-bit counter 211 of the k-th coarse controller 210-k counts the first clock signal f_clk to generate the first count value. Accordingly, the first comparator 212, the second comparator 213, and the first OR circuit 214 of the k-th coarse controller 210-k generate the clock enable signal clk_en in response to the first count value arriving at the k-th coarse duty value Ck_duty and the k-th coarse period value Ck_per, which are each a preset value. The first AND circuit 215 of the k-th coarse controller 210-k generates the k-th fine clock signal gk_clk on the basis of the main clock signal clk in response to the clock enable signal clk_en being 1.

In such an example, as shown in FIGS. 3 and 4, the clock enable signal clk_en is changed from 0 to 1 in the k-th coarse controller 210-k when the first comparison signal com1 output from the first comparator 212 transitions from an active level to a non-active level, and the clock enable signal clk_en is changed from 1 to 0 in the k-th coarse controller 210-k when the second comparison signal com2 output from the second comparator 213 transitions from an active level to a non-active level.

In addition, in such an example, the k-th fine duty value Fk_duty is a value indicating a point in time at which the k-th PWM signal PWMk is changed from 1 to 0 in the k-th fine controller 220-f, and the k-th fine period value Fk_per is a value indicating a point in time at which the k-th PWM signal PWMk is changed from 0 to 1 in the k-th fine controller 220-f.

Thus, the first N/2-bit counter 211 is initialized when the begin signal begin or the set signal set has a value of 1. In this example, a state of the k-th PWM signal PWMk is 1.

The first N/2-bit counter 211 counts the first clock signal f_clk and provides the first count value. As an example, in an example in which the k-th coarse duty value Ck_duty is 2 and the k-th coarse period value Ck_per is 3, in response to the first count value of the first N/2-bit counter 211 being 2 or 3, the clock enable signal clk_en becomes 1 for the first comparator 212, the second comparator 213, and the first OR circuit 214, and in a state in which the clock enable signal clk_en is 1, the k-th fine clock signal gk_clk synchronized with the main clock signal clk and having the same frequency as that of the main clock signal is generated and is then supplied to the second N/2-bit counter 221 of the k-th fine controller 220-k.

In such an example, in response to the first count value of the first N/2-bit counter 211 being the same as the k-th coarse duty value Ck_duty, the k-th fine clock signal gk_clk is supplied to the second N/2-bit counter 221, and the second N/2-bit counter 221 starts to count the k-th fine clock signal gk_clk.

Each of the third comparator 222 and the fourth comparator 223 compares the second count value of the second N/2-bit counter 221 with the k-th fine duty value Fk_duty or the k-th fine period value Fk_per, each of which may be a preset value, and provides the clear signal clear in a state of an active level, for example, 1, and clears the holding circuit 225 to make a level of the k-th PWM signal PWMk 0, in response to the second count value of the second N/2-bit counter 221 being the same, for example, 1, as the k-th fine duty value Fk_duty. Then, also in a case in which the first count value of the first N/2-bit counter 211 becomes 3, which is the k-th coarse period value Ck_per, the k-th fine clock signal gk_clk is generated, such that the second N/2-bit counter 221 is operated, and in an example in which the k-th coarse period value Ck_per is 3 and the k-th fine period value Fk_per is 3, the set signal set is generated, such that a state of the k-th PWM signal PWMk is changed to 1.

Thus, the high frequency multichannel PWM control apparatus according to an example completes a control of the PWM signal during one period through the process as described above.

Meanwhile, the number of clocks required in the high frequency multichannel PWM control apparatus according to examples is illustrated in the following Table 1.

TABLE 1

| N | Number of Channel | Related Art | Present Disclosure | Ratio (%) |
|---|---|---|---|---|
| 8 | 1 | 256 | 304 | 118.75 |
|   | 2 | 512 | 352 | 68.75 |
|   | 4 | 1024 | 448 | 43.75 |
|   | 8 | 2048 | 640 | 31.25 |

TABLE 1-continued

| N | Number of Channel | Related Art | Present Disclosure | Ratio (%) |
|---|---|---|---|---|
| 10 | 1 | 1024 | 1120 | 109.38 |
|  | 2 | 2048 | 1216 | 59.38 |
|  | 4 | 4096 | 1408 | 34.38 |
|  | 8 | 8192 | 1792 | 21.88 |
| 12 | 1 | 4096 | 4288 | 104.69 |
|  | 2 | 8192 | 4480 | 54.69 |
|  | 4 | 16384 | 4864 | 29.69 |
|  | 8 | 32768 | 5632 | 17.19 |

Referring to the example of FIG. 4 and Table 1, when the resolution is 4, such that N=4, and k=1, sixteen main clocks, eight coarse clocks gk_clk, and four first clock signals f_clk are potentially required during one period of the PWM signal.

As another example, when the resolution is N bits and the number of channels is k, the required number of clocks of the first clock signal f_clk is $k \times 2^{N/2}$, the required number of clocks of the main clock signal clk is $2^N + k \times 2 \times 2^{N/2}$, and a total number of clocks required for a PWM control is $2^N + k \times 3 \times 2^{N/2}$.

As another example, as illustrated in the example of Table 1, in an example in which the number of channels is 1, such that k=1, the number of clocks in the present examples is possibly more than a number of clocks in alternative technologies, such that energy consumption of a switching current is possibly greater as compared to alternative technologies.

However, when a multichannel approach, such as an approach using two channels or more is configured, the number of clocks is reduced with respect to alternative approaches, and when 8-channel PWM is configured in an example in which N=10, the number of used clocks is potentially reduced to about ¼ or even less of the number of clocks used in a configuration according to alternative technologies.

Referring to the example of Table 1, power consumption in a digital circuit is in proportion to a state transition and most of the power consumption is accounted for based on an amount of the switching current consumed in the clocks. Accordingly, a reduction in a consumed current is thus expected from examples because they provide a way to reduce switching current consumed in the clocks.

By comparison, when the high frequency multichannel PWM control apparatus according to an example is used in a camera module, in such an example, one PWM channel is used as a controller in order to drive one actuator, or a P-channel or an N-channel are independently controlled. Therefore, when the P-channel and the N-channel are driven independently, a PWM controller for two channels is potentially required for each actuator. When the PWM signal is applied to the actuator, two signals may be applied. As an example, if one PWM signal is used, the signal of N channel or P channel can be fixed Low or High. As another example, there may be a case where one signal of the P-channel and the N-channel is not fixed and the pulse signal is generated independently. When driven in this manner, two PWM output signal may be required.

Alternatively, in an example of an optical image stabilizer (OIS), four-channel PWM outputs are possibly helpful for providing a control in X-axis and Y-axis directions, and an eight-channel PWM control is possibly helpful for an OIS control of a dual camera. Therefore, when an OIS control for the dual camera is being performed, power consumed for performing such a relevant PWM control is reduced to about 21.88% of power consumed in another method according to alternative technologies.

For example, in a system according to the alternative technologies, 1 GHz clocks are desirable to be used in an example in which a PWM period is 1 MHz and a resolution is ten bits. When a ten-bit counter is configured using such 1 GHz clocks, it is possibly difficult to implement the ten-bit counter by a digital circuit, in some examples. For example, if the ten-bit counter is implemented using a high speed cell consuming large amounts of power, the ten-bit counter is comparatively easily implemented. However, in such an example, the high speed cell consuming the large power is used, such that entire current consumption increases.

When two N/2-bit counters are used in the high frequency multichannel PWM control apparatus according to an example, the two N/2-bit counters are relatively easily implemented by a digital circuit, and are possibly implemented using a general low power cell.

In the high frequency multichannel PWM control apparatus according to the example described above, a structure for consuming the lowest power is possibly a structure using the two N/2-bit counters instead of an N-bit counter. When N is an odd number, the two N/2-bit counters are potentially chosen to be, instead, an M-bit counter and an L-bit counter, such that M+L=N and M=L+1. Dividing up the bit counters in this way provides a way to benefit from the general idea of an approach used in examples.

In addition, in order to perform a control, a set value for generating the fine clock signal g_clk is set to an input in the first N-2/bit counter 211, and an input value for fine adjustment of a duty and a period for generating PWM signals are set to the second N/2-bit counter 221.

In such an example, the PWM period and the duty are generally set using a register in a digital circuit. For example, in an example in which the resolution is ten bits, the period and the duty of the PWM signal are set to count values in a range of 0 to 1023.

As an extension of this example, when the resolution is ten bits and the frequency of the main clock signal clk is 1 GHz, a coarse duty value C_duty is 499, a coarse period value C_per is 999, and five hundred clocks, numbered from 0 to 499, assume an active level, for example, 1 or a high level, and the other five hundred clocks assume a non-active level, for example, 0 or a low level, during the coarse duty value C_duty, such that the PWM signal has a duty ratio of 50%. In this example, the frequency of the main clock signal clk is 1 GHz, and a frequency of the PWM signal is thus about 1 MHz.

In the structure of the high frequency multichannel PWM control apparatus according to the examples as described above, when the resolution is changed, each register then consists of two N/2-bit registers. However, in an example, when the resolution is not changed, but is instead fixed to the N bits, the N bits are divided into upper N/2 bits and lower N/2 bits in the register, and set values are input accordingly, as in a configuration according to alternative technologies.

For example, in an example of a ten-bit register, ten bits are divided into an upper five bits and a lower five bits, and are used as input values according to the examples. However, in response to a value of N being changed, it is potentially efficient to have upper N/2 bits and lower N/2 bits be stored in separate registers, respectively, and perform coarse and fine controls as discussed further above. In such an example, when N=10, the coarse control and the fine control are performed using five-bit counters in a configuration according to the examples, such that a range in which the period and the duty are set is limited to five bits. Therefore, the period and the duty are able to assume values ranging from 0 to 31.

Figure 5:
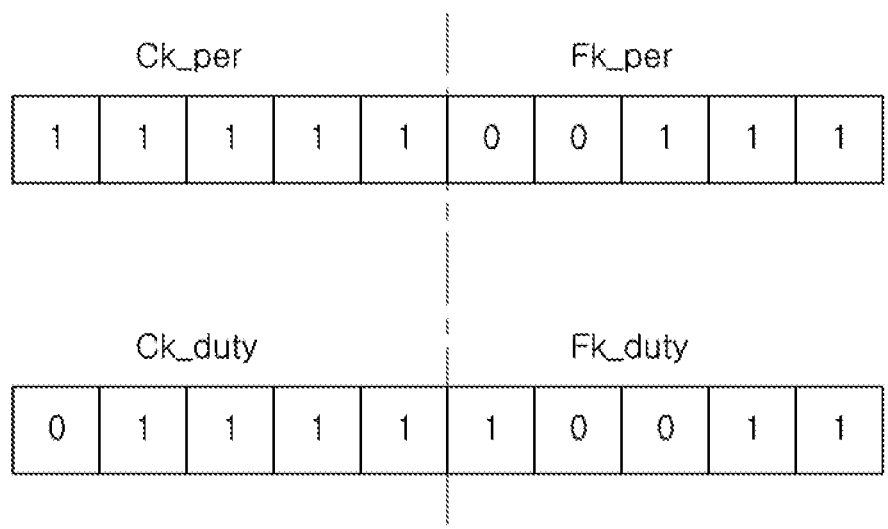
FIG. 5 is an illustrative view illustrating a k-th coarse duty value, a k-th coarse period value, a k-th fine duty value, and a k-th fine period value according to an example.
Figure 6:
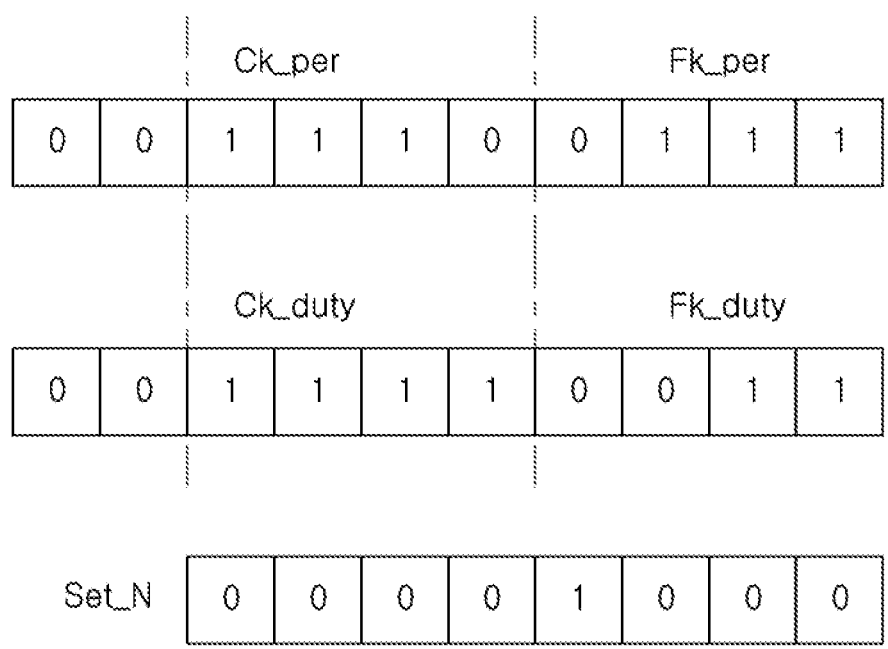
FIG. 6 is an illustrative view illustrating a k-th coarse duty value, a k-th coarse period value, a k-th fine duty value, a k-th fine period value, and an N-bit register according to an example.

As an example, in order to set a PWM period of 1 kHz and a duty ratio of 50%, 999 and 499 are represented by binary numbers as illustrated in the examples of FIGS. 5 and 6

FIG. 5 is an illustrative view illustrating a k-th coarse duty value Ck_duty, a k-th coarse period value Ck_per, a k-th fine duty value Fk_duty, and a k-th fine period value Fk_per according to an example.

Referring to the example of FIG. 5, in an example in which ten bits are divided into upper N/2 bits and lower N/2 bits, and the upper N/2 bits are used for a coarse control and the lower N/2 bits are used for a fine control, the following setting is possible.

In the setting as illustrated in the example of FIG. 5, C_per=31, C_duty=15, F_per=7, and F_duty=19. When N is fixed to a value of 10, ten bits, which are an entire resolution, have only to be divided into upper five bits and lower five bits and be then used in the divided form. Therefore, a register that is to be set by a user is used in the same manner as that of alternative technologies, but when N is changed, registers for a coarse control and a fine control are separately set, according to examples.

FIG. 6 is an illustrative view illustrating a k-th coarse duty value Ck_duty, a k-th coarse period value Ck_per, a k-th fine duty value Fk_duty, and a k-th fine period value Fk_per, and an N-bit register according to an example.

Referring to the example of FIG. 6, as another example, one register for setting a period and one register for setting a duty is provided, and an additional register Set_N for setting the number of bits, which is N, is used.

For example, in an example in which N=8, when the additional register Set_N is set to 8, eight bits may be divided into upper four bits and lower four bits and the upper four bits and the lower four bits are used for operations, as illustrated in the example of FIG. 6. As an example, in FIG. 6, the additional register Set_N is an eight-bit register.

As set forth above, according to the examples, a switching current and an entire consumed current are reduced by reducing the number of high frequency counters having a high resolution as compared to the number of channels.

In addition, in a PWM control apparatus of a camera module having a PWM period of 1 MHz or more and requiring a high resolution control, as the number of channels is increased, a consumed current is further reduced as compared to an apparatus according to alternative technologies.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A high frequency multichannel pulse width modulation (PWM) control apparatus comprising:
    a pre-scaler configured to divide a frequency of a main clock signal to generate a first clock signal; and
    a multichannel PWM generator comprising first to n-th PWM generators, where n is a natural number that is 2 or more, the PWM generators comprising corresponding periods and duties and configured to generate, respectively, first to n-th PWM signals, through first and second N/2-bit counting for the main clock signal, where N is a number of bits of a resolution of the high frequency multichannel PWM control apparatus, using the first clock signal,
    wherein each of the first to n-th PWM generators performs the first N/2-bit counting for the main clock signal based on the first clock signal, a corresponding coarse duty value, and a corresponding coarse period value to generate a fine clock signal, and performs the second N/2-bit counting for the main clock signal based on the fine clock signal, a corresponding fine duty value, and a corresponding fine period value to generate a corresponding PWM signal.

2. The high frequency multichannel PWM control apparatus of claim 1, wherein each of the first to n-th PWM generators comprises:
    a k-th coarse controller configured to generate the fine clock signal based on the main clock signal, the first clock signal, the corresponding coarse duty value, and the corresponding coarse period value; and
    a k-th fine controller configured to generate the corresponding PWM signal based on the fine clock signal, the corresponding fine duty value, and the corresponding fine period value.

3. The high frequency multichannel PWM control apparatus of claim 2, wherein the k-th coarse controller comprises:
    a first N/2-bit counter configured to provide a first count value based on counting the first clock signal;
    a first comparator configured to provide a first comparison signal based on comparing the first count value and a k-th coarse duty value;
    a second comparator configured to provide a second comparison signal based on comparing the first count value and a k-th coarse period value;
    a first OR circuit configured to provide a clock enable signal based on performing an OR operation on the first comparison signal and the second comparison signal; and
    a first AND circuit configured to provide a k-th fine clock signal based on the clock enable signal and the main clock signal.

4. The high frequency multichannel PWM control apparatus of claim 3, wherein the k-th fine controller comprises:
    a second N/2-bit counter configured to provide a second count value based on counting the k-th fine clock signal;
    a third comparator configured to provide a clear signal based on comparing the second count value and a k-th fine duty value;
    a fourth comparator configured to provide a set signal based on comparing the second count value and a k-th fine period value;
    a second OR circuit configured to perform an OR operation on the set signal and a begin signal; and
    a holding circuit configured to set an output terminal based on an output signal from the second OR circuit, reset the output terminal based on the clear signal, and provide a k-th PWM signal.

5. The high frequency multichannel PWM control apparatus of claim 4, wherein the third comparator provides the clear signal having an active level in response to the second count value and the k-th fine duty value being the same, and
the fourth comparator provides the set signal having an active level in response to the second count value and the k-th fine period value being the same.

6. The high frequency multichannel PWM control apparatus of claim 4, wherein the holding circuit sets the output terminal in response to a level of the output signal from the second OR circuit being an active level, resets the output terminal in response to a level of the clear signal being an active level, and provides the k-th PWM signal.

7. The high frequency multichannel PWM control apparatus of claim 4, wherein the holding circuit is an SR flip-flop or an SR latch.

8. The high frequency multichannel PWM control apparatus of claim 4, wherein the first N/2 bit counter is initialized in response to either one or both of a begin or a set signal having an active level and wherein the second N/2 bit counter is initialized in response to the begin signal having an active level.

9. The high frequency multichannel PWM control apparatus of claim 3, wherein the first comparator provides the first comparison signal having an active level in response to the first count value and the k-th coarse duty value being the same, and
the second comparator provides the second comparison signal having an active level in response to the first count value and the k-th coarse period value being the same.

10. The high frequency multichannel PWM control apparatus of claim 3, wherein the first AND circuit comprises an AND gate configured to perform an AND operation on the clock enable signal and the main clock signal and provide the k-th fine clock signal based on a result of the AND operation.

11. A high frequency multichannel pulse width modulation (PWM) control apparatus comprising:
a pre-scaler configured to divide a frequency of a main clock signal to generate a first clock signal; and
a multichannel PWM generator comprising first to n-th PWM generators, where n is a natural number that is 2 or more, the PWM generators comprising corresponding periods and duties and configured to generate, respectively, first to n-th PWM signals through first and second N/2-bit counting for the main clock signal, where N is a number of bits of a resolution of the high frequency multichannel PWM control apparatus, using the first clock signal,
wherein the first PWM generator comprises
a first coarse controller configured to perform the first N/2-bit counting for the main clock signal based on the first clock signal, a first coarse duty value, and a first coarse period value to generate a first fine clock signal; and
a first fine controller configured to perform the second N/2-bit counting for the main clock signal based on the first fine clock signal, a first fine duty value, and a first fine period value to generate a first PWM signal, and
the n-th PWM generator comprises
an n-th coarse controller configured to perform the first N/2-bit counting for the main clock signal based on the first clock signal, an n-th coarse duty value, and an n-th coarse period value to generate an n-th fine clock signal; and
an n-th fine controller configured to perform the second N/2-bit counting for the main clock signal based on the n-th fine clock signal, an n-th fine duty value, and an n-th fine period value to generate an n-th PWM signal.

12. The high frequency multichannel PWM control apparatus of claim 11, wherein a k-th coarse controller comprises:
a first N/2-bit counter configured to provide a first count value by counting the first clock signal;
a first comparator configured to provide a first comparison signal by comparing the first count value and a k-th coarse duty value;
a second comparator configured to provide a second comparison signal by comparing the first count value and a k-th coarse period value;
a first OR circuit configured to provide a clock enable signal by performing an OR operation on the first comparison signal and the second comparison signal; and
a first AND circuit configured to provide a k-th fine clock signal based on the clock enable signal and the main clock signal.

13. The high frequency multichannel PWM control apparatus of claim 12, wherein a k-th fine controller comprises:
a second N/2-bit counter configured to provide a second count value by counting the k-th fine clock signal;
a third comparator configured to provide a clear signal by comparing the second count value and a k-th fine duty value;
a fourth comparator configured to provide a set signal by comparing the second count value and a k-th fine period value;
a second OR circuit configured to perform an OR operation on the set signal and a begin signal; and
a holding circuit configured to set an output terminal based on an output signal from the second OR circuit, to reset the output terminal based on the clear signal, and provide a k-th PWM signal.

14. The high frequency multichannel PWM control apparatus of claim 13, wherein the third comparator provides the clear signal having an active level in response to the second count value and the k-th fine duty value being the same, and
the fourth comparator provides the set signal having an active level in response to the second count value and the k-th fine period value being the same.

15. The high frequency multichannel PWM control apparatus of claim 13, wherein the holding circuit sets the output terminal in response to a level of the output signal from the second OR circuit being an active level, resets the output terminal in response to a level of the clear signal being an active level, and provides the k-th PWM signal.

16. The high frequency multichannel PWM control apparatus of claim 13, wherein the holding circuit is an SR flip-flop or an SR latch.

17. The high frequency multichannel PWM control apparatus of claim 13, wherein the first N/2 bit counter is initialized in response to either one or both of a begin or a set signal having an active level and wherein the second N/2 bit counter is initialized in response to the begin signal having an active level.

18. The high frequency multichannel PWM control apparatus of claim 12, wherein the first comparator provides the first comparison signal having an active level in response to the first count value and the k-th coarse duty value being the same, and the second comparator provides the second comparison signal having an active level in response to the first count value and the k-th coarse period value being the same.

19. The high frequency multichannel PWM control apparatus of claim 12, wherein the first AND circuit comprises an AND gate configured to perform an AND operation on the clock enable signal and the main clock signal and provide the k-th fine clock signal based on a result of the AND operation.

* * * * *